United States Patent
Busch et al.

(10) Patent No.: US 7,859,842 B2
(45) Date of Patent: Dec. 28, 2010

(54) COOLING FACILITY FOR COOLING A COMPONENT

(75) Inventors: Klaus Busch, Amberg (DE); Christian Scharf, Ebermannsdorf (DE); Christoph Wiesner, Amberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 12/381,289

(22) Filed: Mar. 10, 2009

(65) Prior Publication Data
US 2009/0231813 A1 Sep. 17, 2009

(30) Foreign Application Priority Data
Mar. 13, 2008 (EP) .................... 08004683

(51) Int. Cl.
*H05K 7/20* (2006.01)
*G06F 1/20* (2006.01)

(52) U.S. Cl. .............. 361/697; 361/679.47; 361/679.48; 361/679.5; 361/679.54; 361/695; 361/703; 361/704; 361/709; 361/710; 165/80.3; 165/185; 165/908; 174/16.1; 174/16.3

(58) Field of Classification Search ................................. 361/679.46–679.48, 679.5, 679.54, 690, 361/694–695, 697, 703–704, 709–710; 165/80.2–80.3, 165/185, 908; 174/16.1, 16.3
See application file for complete search history.

(56) References Cited

U.S. PATENT DOCUMENTS

| | | | |
|---|---|---|---|
| 4,953,634 A * | 9/1990 | Nelson et al. ............... | 165/147 |
| 5,002,123 A * | 3/1991 | Nelson et al. ............... | 165/147 |
| 5,077,601 A | 12/1991 | Hatada et al. | |
| 5,361,188 A | 11/1994 | Kondou et al. | |
| 5,558,156 A * | 9/1996 | Tsutsui ........................ | 165/84 |
| 5,810,072 A * | 9/1998 | Rees et al. .................. | 165/80.3 |
| 6,125,921 A | 10/2000 | Kuo | |
| 6,364,009 B1 | 4/2002 | MacManus et al. | |
| 6,501,651 B2 * | 12/2002 | Lin et al. ..................... | 361/697 |
| 6,588,497 B1 * | 7/2003 | Glezer et al. .................. | 165/84 |
| 7,010,930 B2 | 3/2006 | Arik et al. | |
| 7,167,363 B1 * | 1/2007 | Cushman et al. ............ | 361/694 |
| 7,215,548 B1 * | 5/2007 | Wu et al. ..................... | 361/703 |
| 2007/0141453 A1 * | 6/2007 | Mahalingam et al. ....... | 429/120 |
| 2008/0050781 A1 * | 2/2008 | Oldham et al. ............. | 435/91.2 |
| 2008/0062644 A1 * | 3/2008 | Petroski ..................... | 361/695 |

FOREIGN PATENT DOCUMENTS

| | | |
|---|---|---|
| EP | 1 353 376 A2 | 10/2003 |
| EP | 1 529 963 A1 | 5/2005 |
| EP | 1 715 566 A2 | 10/2006 |
| EP | 1 717 936 A2 | 11/2006 |
| GB | 2 358 464 A | 7/2001 |

* cited by examiner

*Primary Examiner*—Robert J Hoffberg

(57) ABSTRACT

A heat sink for cooling a component is disclosed. A medium flows around the heat sink by at least sectional guidance of a main flow and a secondary flow of the medium, the main flow being separated from the secondary flow up to a constriction. After the constriction the secondary flow merges with the main flow.

20 Claims, 2 Drawing Sheets

COOLING FACILITY FOR COOLING A COMPONENT

CROSS REFERENCE TO RELATED APPLICATIONS

This application claims priority of European Patent application No. 08004683.2 EP filed Mar. 13, 2008, which is incorporated by reference herein in its entirety.

FIELD OF INVENTION

The invention relates to a heat sink for cooling a component, with a medium able to flow around the heat sink. In addition the invention relates to a cooling facility for cooling a component. The invention also relates to an electronic module with a housing and a cooling facility.

BACKGROUND OF INVENTION

A significant factor in the use of electronic devices, e.g. CPU modules of automation systems, is the volume required to house the device and the resultant device dimensions. With small device dimensions greater attention must be paid to cooling down the electrical components arranged on the device. In addition shorter processing times of CPU modules in automation systems are demanded, which in its turn results in a higher clock frequency of microprocessors used and thus once again to a rise in the power dissipation of the microprocessor, especially with the CPU modules. When the dimensions of the module are smaller and its processor power higher, a cooling facility is required to take away the heat of the components, especially the waste heat of the microprocessors.

The following cooling facilities are known from the prior art. EP 1 529 963 A1 proposes a cooling facility structure with a jet cooler. The jet cooler blows air between upright rectangular cooling fins of a heat sink. A design with a jet cooler and a heat sink is also proposed in EP 1 715 566 A2. Here too air is blown from the side via the jet cooler between the heat sinks. Furthermore a notebook with an cooling facility, in which a jet cooler blows air from the side between the cooling fins of a heat sink, is known from EP 1 717 936 A2. The disadvantage of the prior art is that the known arrangements demand an increased amount of space and can no longer take account of future cooling tasks.

SUMMARY OF INVENTION

An object of the invention is to provide a heat sink or a cooling facility with a more efficient cooling of electrical components compared to the known heat sinks or cooling facilities.

For the heat sink mentioned at the outset, the object is inventively achieved in that, for cooling a component, a guidance of a main flow and of a secondary flow of the medium is present at least in some sections, with the main flow being separated from the secondary flow by a separation means up to a constriction point and the secondary flow and the main flow merging after the constriction. In accordance with the continuity law, in a flow channel which narrows for the main flow, a flow speed and thereby a dynamic pressure of the main flow will increase at the constriction point. A constriction point is taken to be the location which has the smallest cross section within the flow channel. Because of the increased volume flow produced by the constriction the ability of the main flow to accept heat increases and there is advantageously a greater cooling effect.

Advantageously the separation means is arranged with an underside in an angled position to a surface of the heat sink facing towards the component. It is of further advantage here for the separation means to be arranged within the heat sink. The heat sink within a module will thus take up less space, which leads to lower dimensions of the module.

The arrangement of the separation means in an angled position at least partly within the heat sink allows the secondary flow to be created on an upper side of the separation means and the main flow to be guided past the underside of the separation means. In an embodiment which is very easy to implement the separation means is designed as an air deflector plate. The term deflector plate does not necessarily mean that the separation means is made of metal. It merely involves a type of guide fin made from any given material for a flow which enters the heat sink. The flowing medium can for example be air or another gas or liquid coolant.

Preferably the underside and the surface are arranged as delimiters of a main flow channel for the main flow.

In a further advantageous embodiment a cross section available for the main flow narrows down from a main flow entry to a constriction point. This type of continuously narrowing flow channel promotes the flow and the subsequent sucking in of the secondary flow after the constriction.

With an embodiment of the heat sink with cooling fins, a number of cooling fins are preferably arranged perpendicular to the surface.

A further optimization of the cooling power can be achieved by the cooling fins being designed such that the secondary flow is sucked in from a zone free of cooling fins. For example no cooling fins are formed the area of the secondary flow, starting from an air entry via a ventilation grid of a module up to a constriction. From there the secondary flow undergoes only a slight temperature increase on entry into the module, since before the constriction it is not yet in contact with the cooling fins, meaning that it can gradually exercise its full cooling effect on entry into the cooling fins after or at the constriction.

The flow conditions for the main flow and the secondary flow are further optimized if the separation means is arranged essentially at right angles to the cooling fins and thereby at an angle in the range of 45 to 5 degrees, preferably in the range of 30 to 10 degrees, preferably in the range of 25 to 15 degrees to the surface.

The object stated at the outset is achieved by the cooling facility with a heat sink as claimed in the claims by the separation means being embodied at least partly by an underside of a coolant flow generation means. The coolant flow generation means is preferably arranged in this case at an angle in the range of 45 to 5 degrees, preferably in the range of 30 to 10 degrees, preferably in the range of 25 to 15 degrees to a surface of the heat sink facing towards the component. In this case the separation means is essentially arranged at right angles to the cooling fins.

To boost the cooling power further a base plate is preferably arranged on the surface. This base plate allows transport of heat in the base plate from the component to be cooled in the direction of the main flow, with the base plate being in contact with the component.

In a cooling facility, with the heat sink featuring cooling fins, with the cooling fins being designed so that within a space spanned by the maximum three-dimensional dimensions of the heat sink a recess for accepting the coolant flow generation means is formed, with the cooling fins being arranged perpendicular to the underside, the coolant flow generation means used as a separation means is advantageously arranged at least partly within the heat sink. This means that the cooling facility occupies less space within a module which leads to smaller dimensions of a module.

Preferably the coolant flow generation means is arranged on the cooling fins such that it applies the medium over at least one opening between the cooling fins. This "pumping in" of for example pulsed air behind the constriction, viewed in the direction of flow, further improves the cooling performance.

For an electronic module with a housing and a heat sink an efficient cooling while adhering to a minimum required module size can be guaranteed.

Further thoughts relevant for the invention are as follows:

Good flow conditions for the medium are produced if the underside and the surface are arranged as delimiters of the main flow channel for a main flow. The main flow is designated as the flow of the medium which is directed close to the component to be cooled in the heat sink and over the base plate of the heat sink.

Preferably the coolant flow generation means is embodied as a jet cooler. A jet cooler for example has an internal structure comprising a plunger coil magnet system which periodically causes a membrane to oscillate. This membrane is integrated into a chamber which periodically explicitly directs a pulse of air through one or more openings in the direction of the element to be cooled, e.g. of a heat sink. In the area of application of industrial automation technology jet coolers are used as opposed to turbine fans because of their increased service life.

BRIEF DESCRIPTION OF THE DRAWINGS

A useful embodiment and further explanations emerge from the drawing. The figures are as follows.

DETAILED DESCRIPTION OF INVENTION

Figure 1:
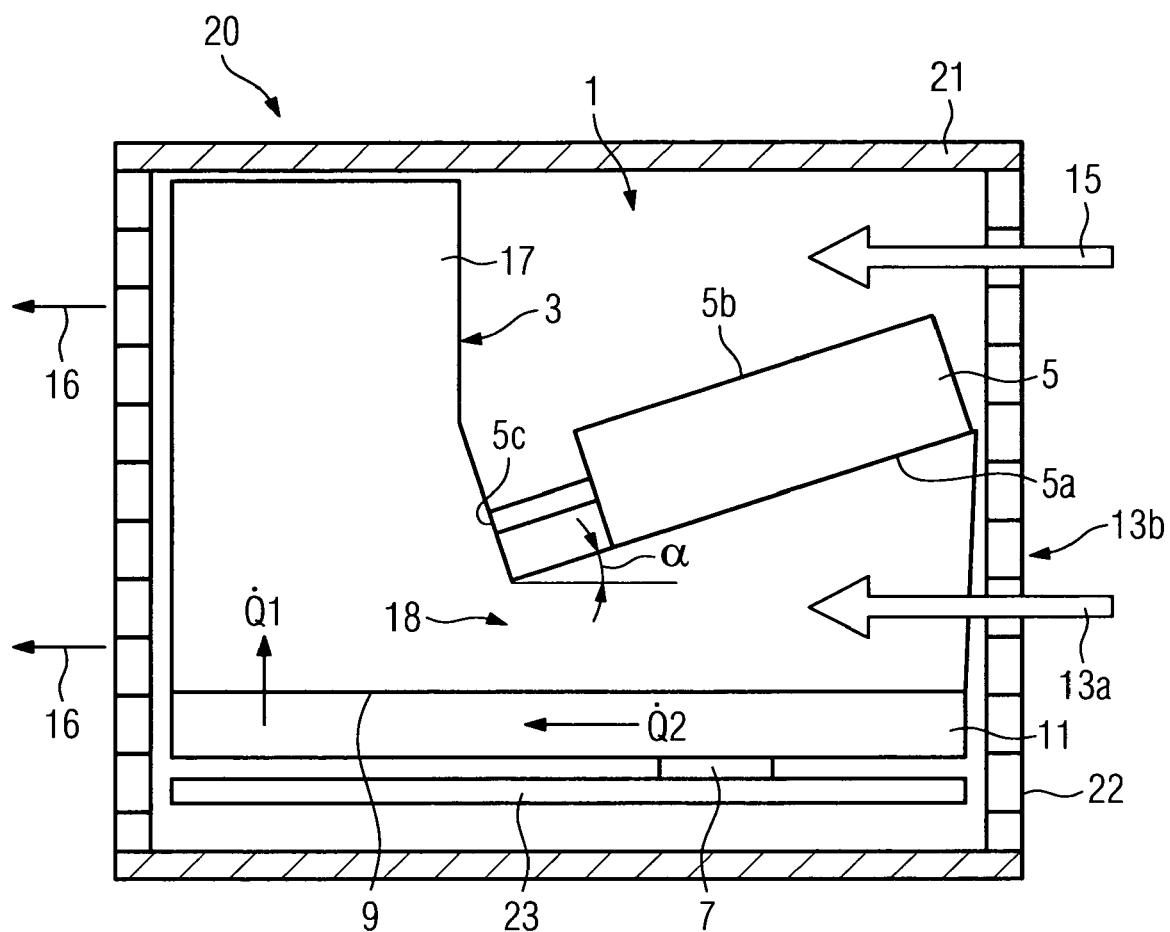
FIG. 1 a module with a housing and a cooling facility.

In accordance with FIG. 1 a module 20 with a cooling facility 1 arranged within a housing 21 is shown viewed from the side without a side cover. The cooling facility 1 features a heat sink 3 and a jet cooler 5 with an underside 5a and an upper side 5b. The heat sink 3 is arranged on a base plate 11. This base plate 11 is thermally connected to a component 7. The component 7 is arranged on a circuit board 23. Microprocessors of CPU modules are usually cooled with these types of cooling facilities 1. The heat sink 3 is essentially embodied as a cuboid shape with a plurality of cooling fins 17 and a recess for accepting the jet coolers 5 within the space which is formed by the maximum three-dimensional measurements of the heat sink. The cooling fins 17 which are arranged in a section for a main flow 13a underneath on the underside 5a of the jet cooler 5 are at an angle α of 20 degrees to the base plate 11 or to the surface 9 of the heat sink 3. The jet cooler 5 is arranged on the cooling fins 17 such that a cooling medium of the jet cooler 5 is applied between the cooling fins 17 via at least one opening 5c. Below the jet cooler 5 the main flow 13a can flow in via a main air entry 13b between the underside 5a of the jet cooler and an upper side of the base plate 11 between the cooling fins 17. The main flow 13a in this case flows through a ventilation grid 22 which is a component of the housing 21 of the module 20. A preferred direction of installation of this module 20 is that the main flow 13a can enter from below into the module 20 and can escape as an exhaust air flow 16 through a further ventilation grid above the module 20. For a final installation position of the module 20 the module 20 would thus have an installation position which, in relation to the drawing, corresponds to a position turned to the right by 90°.

At a constriction 18 of the main flow 13a, as a result of an increased dynamic pressure of the air sucked in from outside, there is a drop in wall pressure in accordance with Bernoulli's law. This drop in wall pressure at the constriction 18, which acts as a nozzle, results in the secondary air flow 15 being able to be sucked in from a rib-free zone. The secondary air flow, which is cooler compared to the main flow 13a, can now combine at the point to the left of the constriction 18 with the already heated up main flow 13a and thus ensure a further cooling down of the heat sink 3. As a result of this temperature reduction, a drop in temperature exists between the main flow 13a after the constriction 18 and the upper side of the base plate 11 and heat can be transported Q1 to air flowing through the cooling fins 17. Since there is now likewise a further drop in temperature in the base plate 11 in the area of a heat source which is produced by the component 7 and the constriction 18, there is also a further transport of heat Q2 in the direction shown by the arrow within the base plate 11 leading away from the component 7 to be cooled. Advantageous with this arrangement is the arrangement of the jet cooler 5 with its underside 5a towards the base plate 11 at an angle of appr. 20°, whereby the constriction 18 in the throughflow direction of the main flow 13a is created between the underside 5a of the jet cooler and the upper side of the base plate 11.

Figure 2:
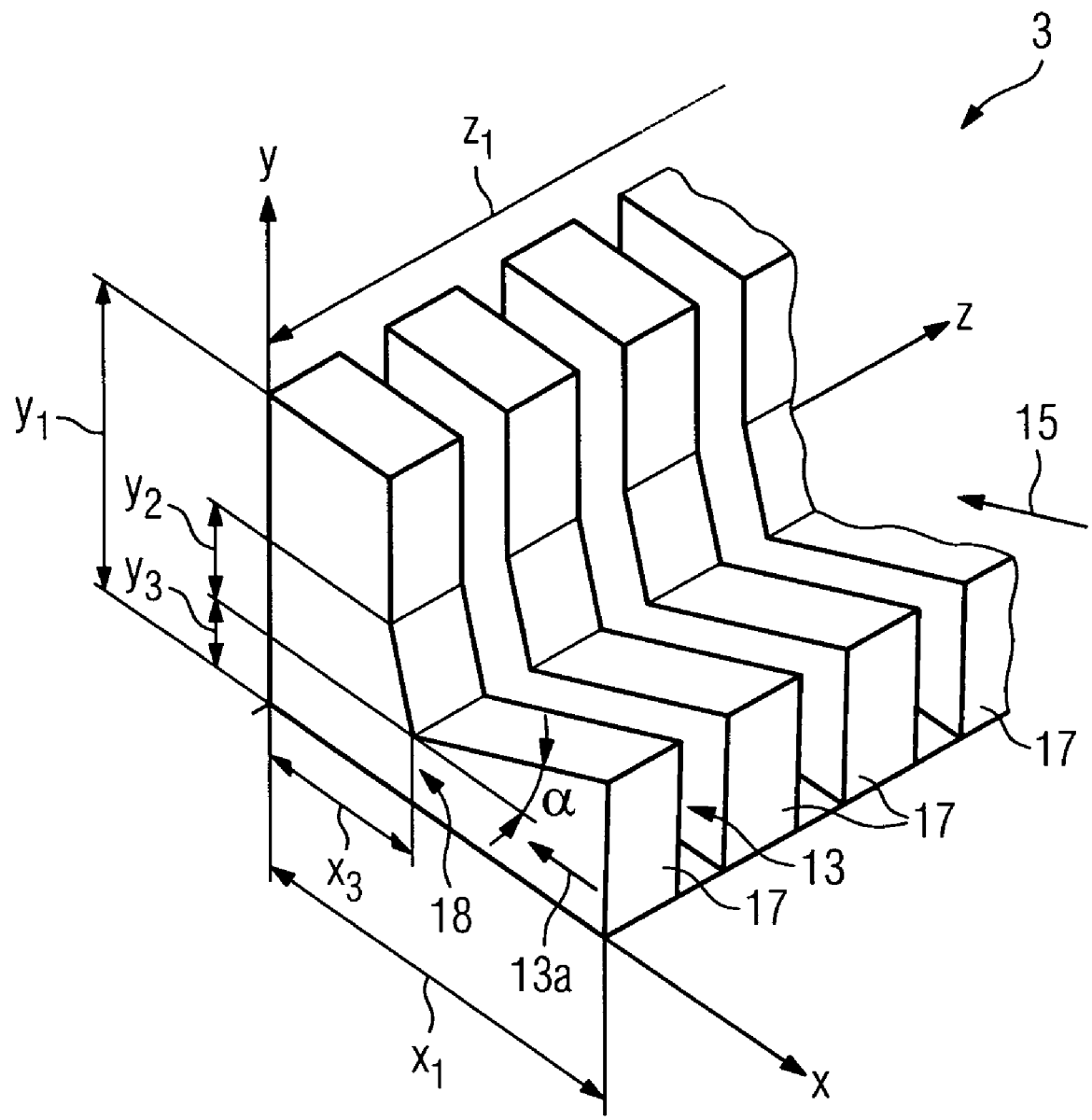
FIG. 2 a heat sink in a three-dimensional view.

Depicted in FIG. 2 is a simplified three-dimensional diagram of the heat sink 3. In the X-orientation the heat sink 3 has an extent of X1, in the Y-direction the heat sink has an extent of Y1 and in the Z-direction an extent of Z1. The cooling fins 17 standing perpendicular on the XZ plane form the main flow channel 13 in this case. In the direction of the Z-extent the heat sink has a Y extension of Y2 at the points X1. To form an angled position for subsequently accepting the jet cooler 5 known from FIG. 1 the Y values have a value of Y3 at the points X3. The value for Y3 is smaller than the value for Y2, thus an angle α is formed for the incline of for example 20° C. By this embodiment at the values for X3 the constriction 18 in respectively each flow channel embodied by the cooling fins 17, the underside of the jet cooler 5 and the underside of the heat sink 3 lying in the XY-plane is formed within the heat sink.

The invention claimed is:

1. A heat sink for cooling a component, with a medium able to flow around the heat sink, comprising:
   a main flow and a secondary flow of the medium at least in sections;
   a constriction; and
   a separation element, the separation element being a coolant flow generation unit,
   wherein the main flow is separated from the secondary flow by the separation element up to the constriction, and the secondary flow merges with the main flow after the constriction, the secondary flow merged with the main flow being an exhaust air flow,
   wherein the main flow and the secondary flow enter the heat sink in a horizontal direction, and
   wherein the exhaust air flow leaves the heat sink in a horizontal direction.

2. The heat sink as claimed in claim 1, wherein the separation element is arranged with an underside in an angled position to a surface of the heat sink, a base plate being arranged on the surface of the heat sink.

3. The heat sink as claimed in claim 2, wherein the underside of the separation element and the surface of the heat sink are arranged as delimiters of a main flow channel for the main flow.

4. The heat sink as claimed in claim 2, wherein a plurality of cooling fins is arranged perpendicular to the surface of the heat sink.

5. The heat sink as claimed in claim 4, wherein the plurality of cooling fins are embodied such that the secondary flow is sucked in from an area free of the plurality of cooling fins.

6. The heat sink as claimed in claim 4, wherein the separation element is essentially arranged perpendicular to the cooling fins and at an angle in the range of 45 to 5 degrees to the surface of the heat sink.

7. The heat sink as claimed in claim 4, wherein the separation element is essentially arranged perpendicular to the cooling fins and at an angle in the range of 25 to 15 degrees to the surface of the heat sink.

8. The heat sink as claimed in claim 1, wherein a cross section is available for the main flow reducing from a main air entry point down to the constriction.

9. The heat sink as claimed in claim 1, wherein the cooling flow generation unit is at least one jet cooler.

10. A cooling facility, comprising:
a heat sink for cooling a component, with a medium able to flow around the heat sink, the heat sink having a main flow and a secondary flow of the medium at least in sections, a constriction, and a separation element, wherein the main flow is separated from the secondary flow by the separation element up to the constriction, and the secondary flow merges with the main flow after the constriction, the secondary flow merged with the main flow being an exhaust air flow, wherein the separation element is embodied as a coolant flow generation unit, wherein the main flow and the secondary flow enter the heat sink in a horizontal direction, and wherein the exhaust air flow leaves the heat sink in a horizontal direction.

11. The cooling facility as claimed in claim 10, wherein the coolant flow generation unit is arranged with an underside in an angled position to a surface of the heat sink, a base plate being arranged on the surface of the heat sink.

12. The cooling facility as claimed in claim 10, wherein the coolant flow generation unit is arranged on the cooling fins such that it applies the medium between the cooling fins via at least one opening.

13. An electronic module comprising:
a housing; and
a heat sink for cooling a component, with a medium able to flow around the heat sink, the heat sink having a main flow and a secondary flow of the medium at least in sections, a constriction, and a separation element, the separation element being embodied as a cooling flow generation unit, wherein the main flow is separated from the secondary flow by the separation element up to the constriction and the secondary flow merges with the main flow after the constriction, the secondary flow merged with the main flow being an exhaust air flow,
wherein the main flow and the secondary flow enter the heat sink in a horizontal direction,
wherein the exhaust air flow leaves the heat sink in a horizontal direction, and
wherein the heat sink is arranged within the housing.

14. The electronic module as claimed in claim 13, wherein the separation element is arranged with an underside in an angled position to a surface of the heat sink, a base plate being arranged on the surface of the heat sink.

15. The electronic module as claimed in claim 14, wherein the underside of the separation element and the surface of the heat sink are arranged as delimiters of a main flow channel for the main flow.

16. The electronic module as claimed in claim 13, wherein a cross section is available for the main flow reducing from a main air entry point down to the constriction.

17. The electronic module as claimed in claim 13, wherein a plurality of cooling fins is arranged perpendicular to the surface of the heat sink.

18. The electronic module as claimed in claim 17, wherein the plurality of cooling fins are embodied such that the secondary flow is sucked in from an area free of the plurality of cooling fins.

19. The electronic module as claimed in claim 17, wherein the separation element is essentially arranged perpendicular to the cooling fins and at an angle in the range of 45 to 5 degrees to the surface of the heat sink.

20. The electronic module as claimed in claim 13, wherein the cooling flow generation unit is at least one jet cooler.

* * * * *